United States Patent
Fomenkov et al.

[11] Patent Number: 6,094,448
[45] Date of Patent: Jul. 25, 2000

[54] GRATING ASSEMBLY WITH BI-DIRECTIONAL BANDWIDTH CONTROL

[75] Inventors: Igor V. Fomenkov, San Diego; Frederick G. Erie, Oceanside; Alexander I. Ershov, San Diego, all of Calif.

[73] Assignee: Cymer, Inc., San Diego, Calif.

[21] Appl. No.: 09/248,466

[22] Filed: Feb. 11, 1999

Related U.S. Application Data

[63] Continuation-in-part of application No. 08/886,715, Jul. 1, 1997.

[51] Int. Cl.[7] .................................................. H01S 3/08
[52] U.S. Cl. ............................ 372/102; 372/20; 372/107; 385/37; 359/573
[58] Field of Search .................................. 372/20, 32, 29, 372/98, 102, 107; 385/37; 359/130, 573, 574, 575; 356/328, 330

[56] References Cited

U.S. PATENT DOCUMENTS

| | | | |
|---|---|---|---|
| 4,360,925 | 11/1982 | Brosnan et al. | 372/95 |
| 4,803,696 | 2/1989 | Pepper et al. | 372/95 |
| 5,012,483 | 4/1991 | Reintjes et al. | 372/95 |
| 5,043,998 | 8/1991 | Cooper et al. | 372/95 |
| 5,095,492 | 3/1992 | Sandstrom | 372/102 |
| 5,150,370 | 9/1992 | Furuya et al. | 372/106 |
| 5,216,680 | 6/1993 | Magnusson et al. | 372/20 |
| 5,327,449 | 7/1994 | Du et al. | 372/95 |
| 5,347,327 | 9/1994 | Favre et al. | 372/20 |
| 5,559,816 | 9/1996 | Basting et al. | 372/27 |
| 5,596,596 | 1/1997 | Wakabayashi et al. | 372/102 |
| 5,767,965 | 6/1998 | Zhou et al. | 356/328 |
| 5,852,627 | 12/1998 | Ershov | 372/108 |
| 5,999,671 | 12/1999 | Jin et al. | 385/37 |
| 6,018,535 | 1/2000 | Maeda | 372/20 |
| 6,026,100 | 2/2000 | Maeda | 372/20 |

OTHER PUBLICATIONS

Duart and Piper, "Comparison of prism–expander and grazing–incidencegrating cavities for copper laser pumped dye lasers", Applied Optics, Vo.21, No. 15 (Aug. 1, 1982), pp. 2782–2786.

Giuri, et al., "Output coupler design for unstable cavities of excimer lasers", Applied Optics, vol. 36, No. 6 (Feb. 20, 1997), pp. 1443–1148.

Magni, et al., "Resonators with Variable Reflectivity Mirrors",in The Physics and Technology Laser Resonators, (Bristol and New York: Hilger 1989), pp. 94–105.

Shaw, "Excimer Laser Resonators",in The Physics and Technology of Laser Resonators,(Bristol and New York: Hilger 1989), pp. 237–245.

Reintjes, "Coherent Ultraviolet and Vacuum Ultraviolet Sources",in Laser Handbook, vol. 5, Edited by Bass and Stitch (North–Holland:Elsevier, 1985), pp. 44–50.

*Primary Examiner*—Hemang Sanghavi
*Attorney, Agent, or Firm*—John R. Ross, Esq.

[57] ABSTRACT

A bidirectional bandwidth controlled grating assembly. A spring housing is connected to one of two end plates extending away from the lined surface of the grating. An adjustment rod threaded through the other end plate extends into the spring housing. Inside the spring housing in a preferred embodiment are two compression springs mounted between pressure surfaces in the housing and a piston which is fixed on the adjustment rod. The lined surface of the grating can be made more concave (or less convex) by screwing the rod in a direction into the spring housing compressing one of the springs to push the end plates apart and the surface can be made more convex (or less concave) by screwing the rod in a direction out of the spring housing compressing the other spring to pull the end plates toward each other.

8 Claims, 5 Drawing Sheets

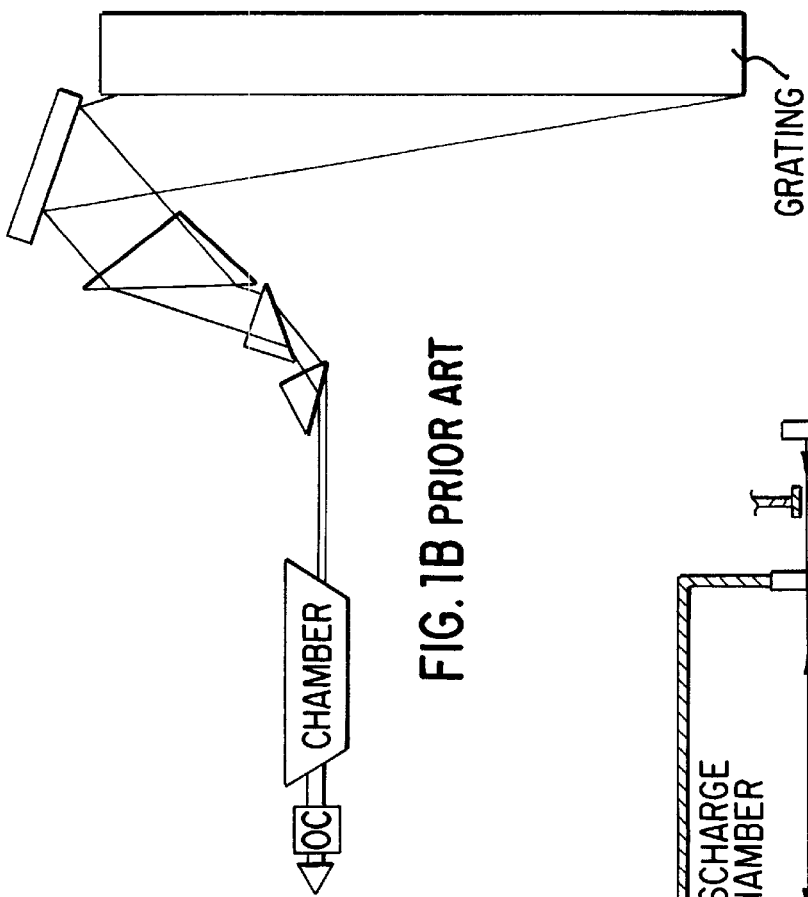
FIG. 1B PRIOR ART
FIG. 1A PRIOR ART
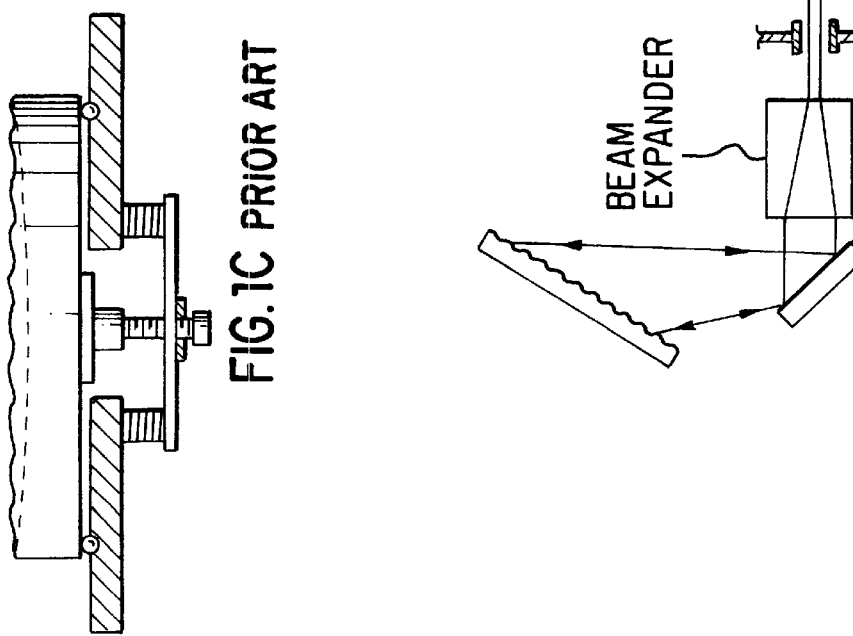
FIG. 1C PRIOR ART

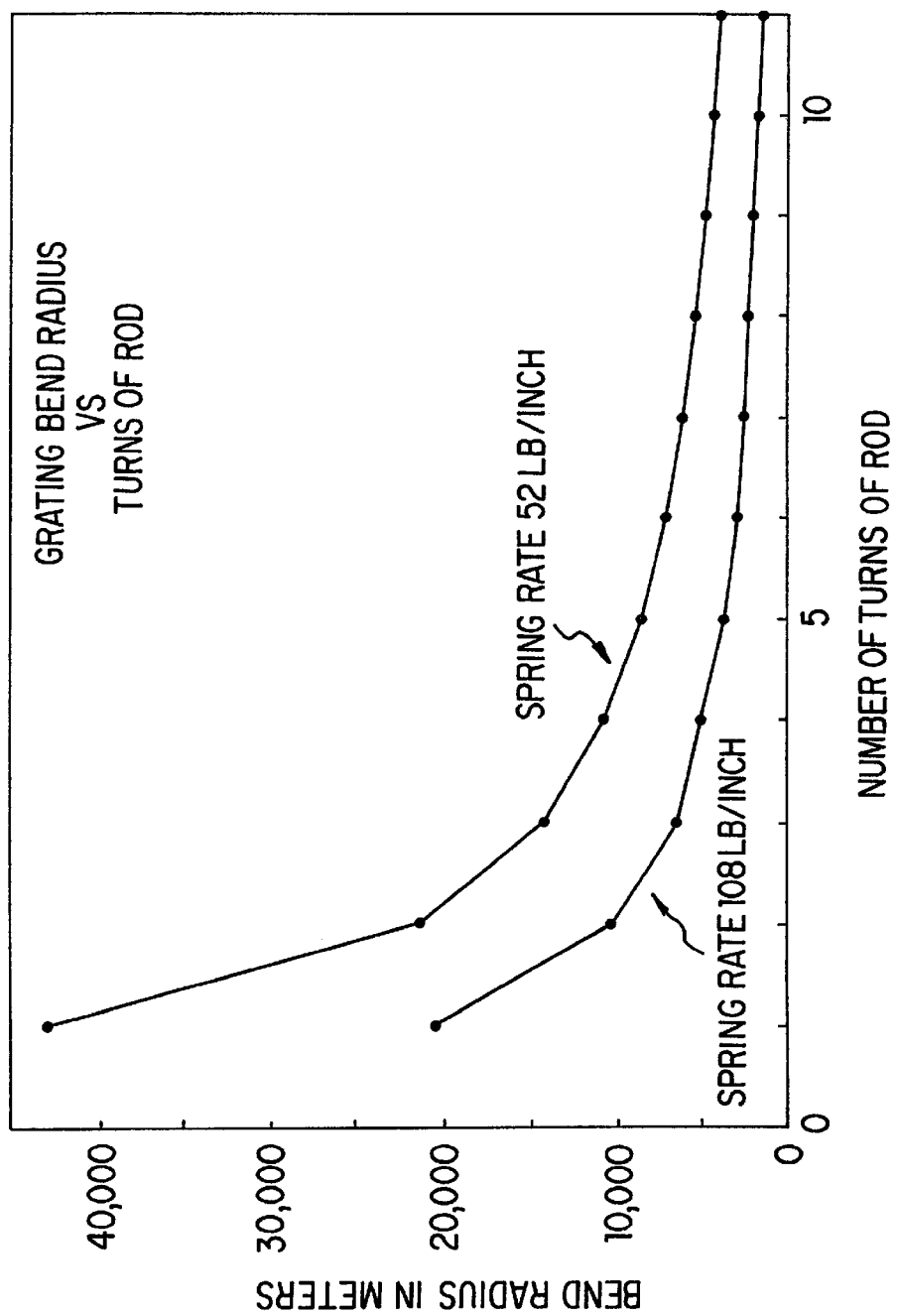

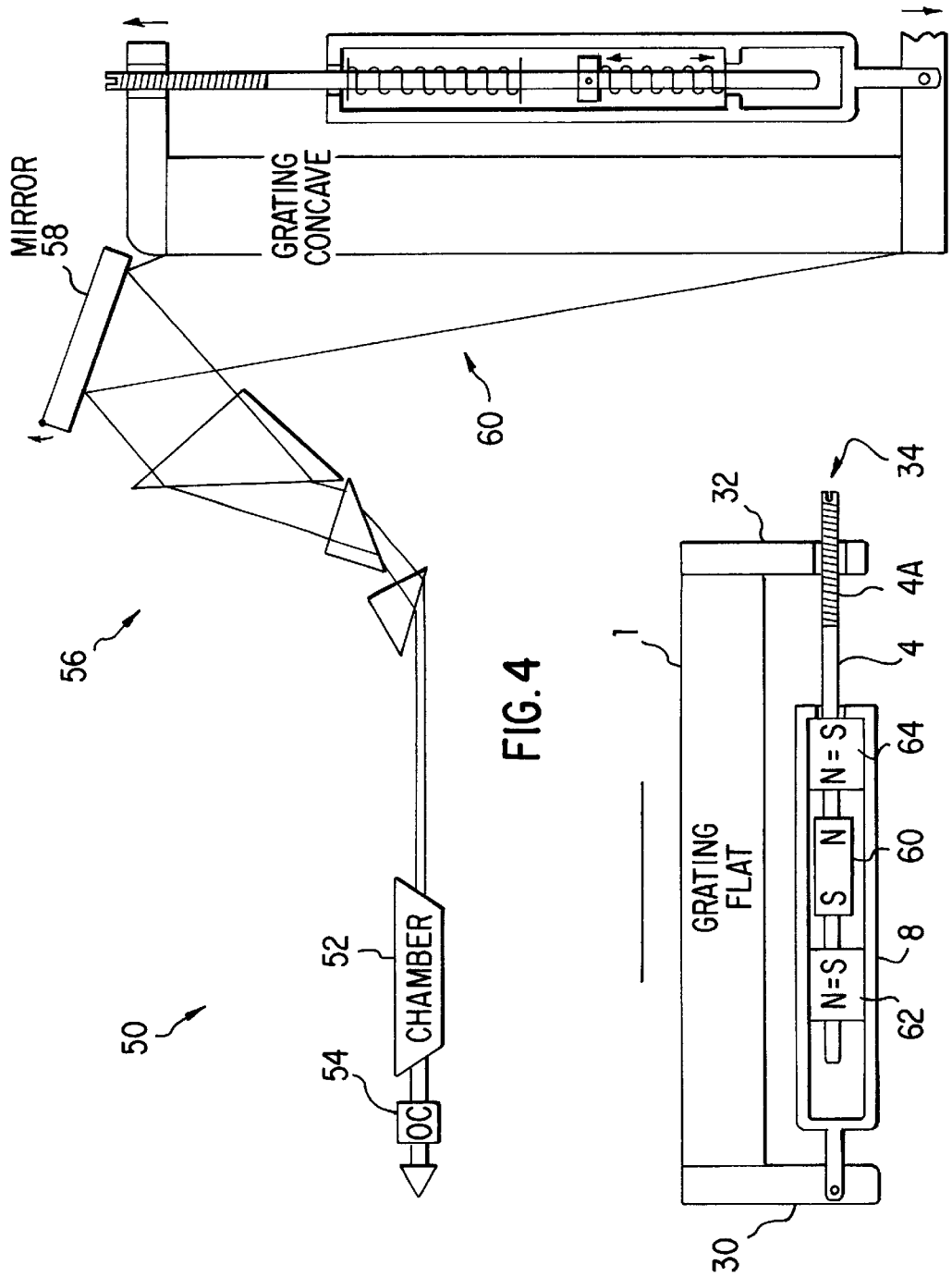

GRATING ASSEMBLY WITH BI-DIRECTIONAL BANDWIDTH CONTROL

This application relates to gratings and in particular to bandwidth controlled gratings. This application is a continuation-in-part of Ser. No. 08/886,715 filed Jul. 1, 1997.

BACKGROUND OF THE INVENTION

Use of gratings for line narrowing of lasers is well known. See, for example, U.S. Pat. Nos. 5,095,492 and 5,852,627. Typically, a line narrowing unit consists of a grating and a beam expander. Such prior art techniques are shown in FIG. 1A which is also FIG. 1 is U.S. Pat. No. 5,095,492 and FIG. 1B which is also FIG. 1 in U.S. Pat. No. 5,852,627. In these prior art embodiments, the laser is tuned by pivoting the pivot mirror as specifically shown in FIG. 1B to change the angle of illumination of the grating which in each of these cases is arranged in Littrow configuration. The laser could also be tuned by pivoting the grating.

As explained in U.S. Pat. No. 5,095,492 the wave front of the light illuminating the grating typically deviates from a flat front due to distortions produced by the various optical components of the laser. U.S. Pat. No. 5,095,492 discloses a technique for bending the grating to make the lined surface increasingly curved to compensate for the curvature of the illuminating beam. The bandwidth of the laser can be substantially reduced by proper adjustment of the curvature of the lined surface of the grating.

SUMMARY OF THE INVENTION

The present invention provides a bidirectional bandwidth controlled grating assembly. A spring housing is connected to one of two end plates extending away from the lined surface of the grating. An adjustment rod threaded through the other end plate extends into the spring housing. Inside the spring housing in a preferred embodiment are two compression springs mounted between pressure surfaces in the housing and a piston which is fixed on the adjustment rod. The lined surface of the grating can be made more concave (or less convex) by screwing the rod in a direction into the spring housing compressing one of the springs to push the end plates apart and the surface can be made more convex (or less concave) by screwing the rod in a direction out of the spring housing comprising the other spring to pull the end plates toward each other.

BRIEF DESCRIPTION OF THE DRAWINGS

FIGS. 1A and 1B show prior art grating based line narrowing configurations.

FIG. 3 is a chart showing curvature as a function of rod turns.

FIG. 4 shows an excimer laser system using the present invention for bandwidth control.

FIG. 6 shows a second preferred embodiment using magnets to provide compressive force.

DETAILED DESCRIPTION OF THE PREFERRED EMBODIMENTS

Figure 2A:
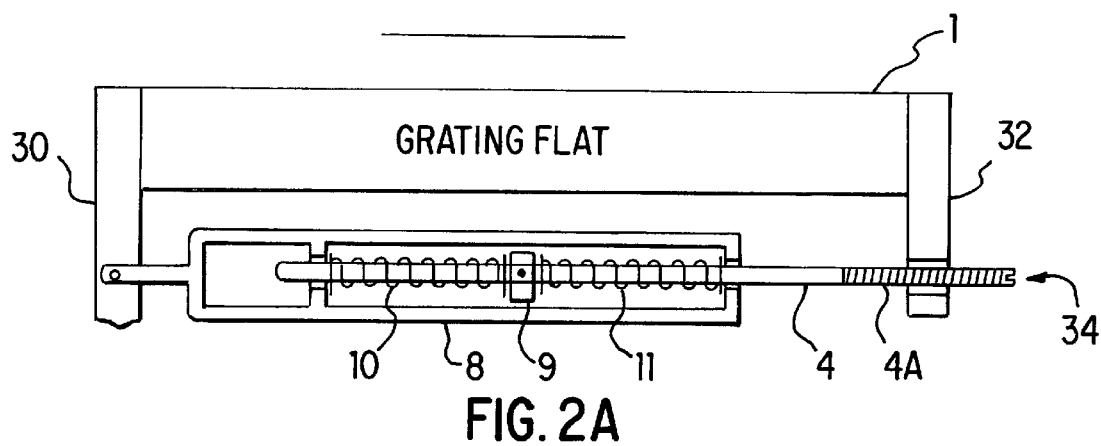
FIGS. 2A, 2B and 2C demonstrate the functioning of a preferred embodiment of the present invention.
Figure 2B:
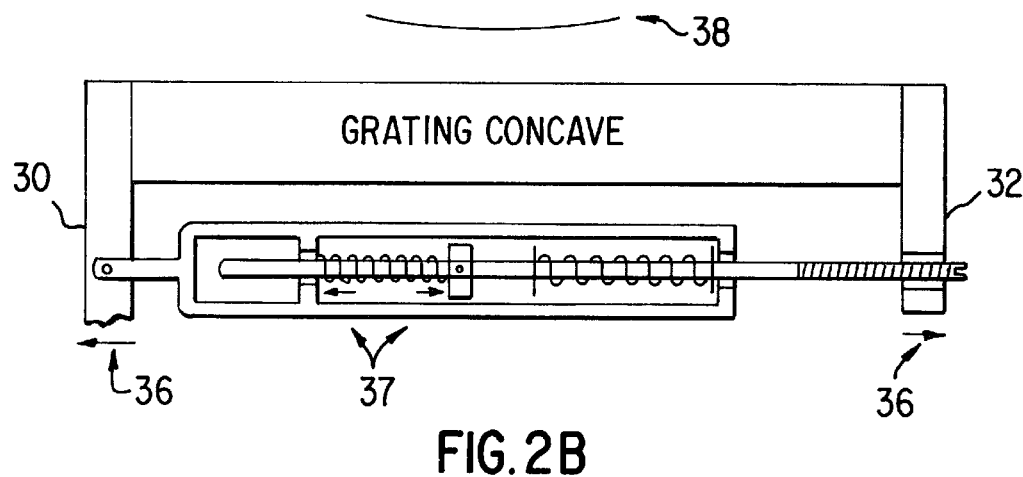
Figure 2C:
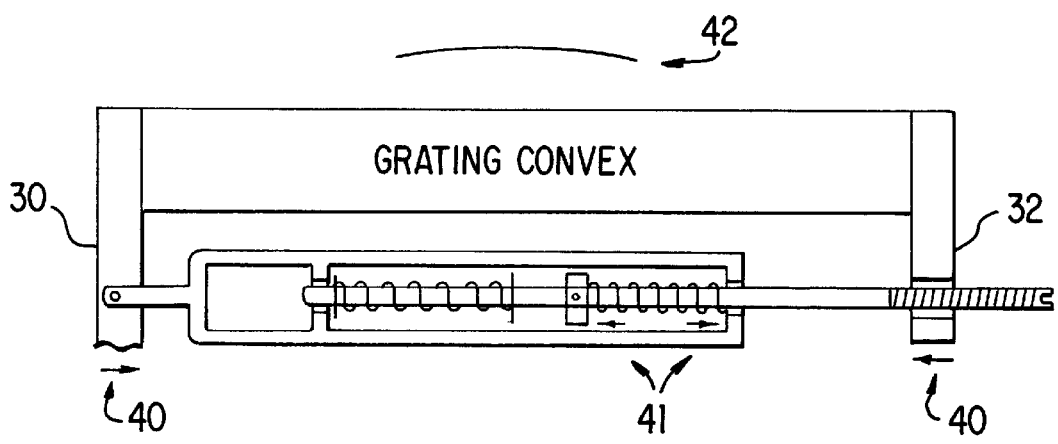

The basic elements and a functional description of the operation of a preferred embodiment of the present invention is shown in FIGS. 2A, 2B and 2C. FIG. 2A shows a grating assembly having a bidirectional control unit attached to it but with no bending force applied to the grating. Shown are grating 1, left end plate 30, right end plate 32, compression spring housing 8, left compression spring 10, right compression spring 11, adjustment shaft 4 and piston 9 which is fixedly pinned to adjustment shaft 4. Adjustment shaft 4 comprises threaded length 4A (¼-28 UNF-3B×1.38 long) which mates with threaded channel in right end plate 32. In the FIG. 2A condition, both springs are applying equal compressive force which can offset each other or both springs may be unloaded. The curvature of the grating surface is adjusted by turning shaft with an allen wrench fitted into socket 34. By screwing shaft 4 into housing 8, left compression spring 10 is compressed against the left side of housing 8 and piston 9 as shown by the two arrows 37 inside housing 8 in FIG. 2B. The compression force pushes rod 4 to the right and housing 8 to the left which has the effect of pushing apart the two end plates 30 and 32 as shown by arrows 36. This has the effect of bending the surface of grating 1 in a concave direction as shown by line 38.

Conversely, by screwing shaft 4 in a direction to drive rod 4 out of housing 8, right compression spring 11 is compressed against the right side of housing 8 and piston 9 as shown by the two arrows 41 inside housing 8 in FIG. 2C. The compressive force pulls rod 4 to the left and pulls housing 8 to the right which has the effect of pulling end plates 30 and 32 together as shown by arrows 40. This has the effect of bending the surface of grating 1 in a convex direction as shown by line 42.

FIG. 3 shows the resulting curves of bend radius versus the number of turns of rod 4 with 28 threads per inch for springs rated at 52 pounds per inch and 108 pounds per inch. As shown in FIG. 3 operators are able with this design to make extremely fine adjustments to the curvature of the grating surface.

Figure 5:
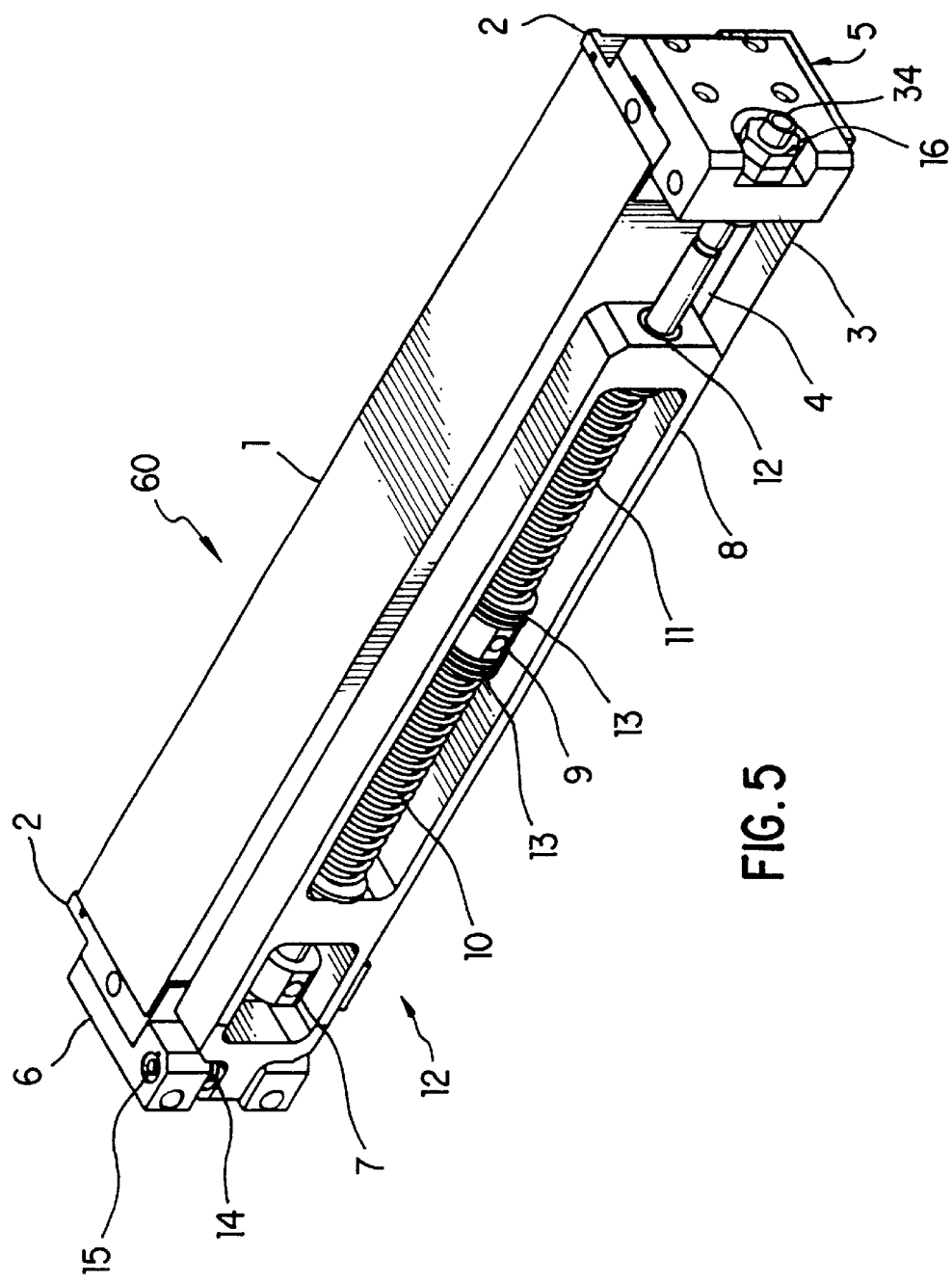
FIG. 5 is a perspective view of a preferred embodiment of the present invention.

FIG. 5 is a perspective view of a grating assembly 60 fabricated by Applicants and their co-workers. The assembly is comprised of grating 1, two grating end plates 2 (bonded to grating 1) right bidirectional bandwidth control end plate 5, lock nut 16, invar base plate 3 bonded to grating 1, alignment rod 4, socket 34, two linear bearings 12, compression spring housing 8, right compression spring 11, two thrust bearings 13, piston 9 pinned to rod 4, left compression spring 10, travel limiting piston 7 pinned to rod 4, radial ball bearing 14, pivot shaft 15 and left bandwidth control end plate 6.

FIG. 4 shows a preferred embodiment of the present invention utilized to control bandwidth of an excimer laser system 50 comprising laser chamber 52, output coupler 54, prism beam expander 56 consisting of three prisms, pivotable tuning mirror 58 and grating assembly 60 which is the same as the assembly shown in FIGS. 1, 2A, 2B and 2C.

In many applications initial and periodic such as weekly or monthly adjustments by hand are sufficient for bandwidth control. However, a motor can be provided to drive rod 4 and the curvature of the grating could be controlled with a feedback control system based on bandwidth measurements. In this case adjustments could be made at virtually any frequency, such as many times per second.

Although this invention has been disclosed and illustrated with reference to particular embodiments, the principals involved are susceptible for use in numerous other embodiments which will be apparent to persons skilled in the art. For example, three strong permanent magnets could be used in the place of the two compression springs with one of the magnets replacing the piston as shown in FIG. 6. Magnet 60 is fixed to rod 4 and magnets 62 and 64 are fixed to housing 8. Rod 4 passes through holes in magnets 62 and 64. The effect of screwing rod 4 into and out of housing 8 is substantially the same as described above. The invention is therefore to be limited only as indicated by the scope of the appended claims and their legal equivalents.

We claim:

1. A bi-directional bandwidth controlled grating assembly comprising:

A) a grating defining a lined surface and a first end and a second end;
   B) a first end plate attached to said first end and extending in a direction away from said lined surface;
   C) a second end plate attached to said second end and extending in a direction away from said lined surface and having a threaded channel;
   D) a spring housing connected to said first end plate and defining a first pressure surface and a second pressure surface;
   E) an adjustment rod having a threaded section threaded into said threaded channel of said second end plate and extending into said spring housing;
   F) an adjustment rod piston fixed on said adjustment rod;
   G) a first compression element mounted between said first pressure surface and said adjustment rod piston;
   H) a second compression element mounted between said second pressure surface and said adjustment rod piston;

wherein said lined surface is made more concave or less convex by an action of screwing said adjustment rod in a direction to cause it to extend into said spring housing and said line surface is made more convex or less concave by an action of screwing said adjustment rod in a direction to cause it to withdraw from said spring housing.

2. An assembly as in claim 1 wherein said first and second compression elements are springs.

3. An assembly as in claim 1 wherein said spring housing is pivotably attached to said first end plate.

4. An assembly as in claim 1 and also comprising at least two linear bearings for permitting said adjustment rod to extend substantially friction-free into said spring housing.

5. An assembly as in claim 1 and further comprising at least two thrust bearings mounted adjacent to said adjustment rod piston for permitting said adjustment rod to be rotated without causing substantial rotation of said first and second compression springs.

6. An assembly as in claim 1 wherein said first and second compression elements are comprised of two permanent magnets fixed to said spring housing and one permanent magnet fixed to said adjustment rod.

7. An assembly as in claim 1 wherein said assembly is installed in a line narrowing module mounted on a laser for line narrowing output beams of the laser.

8. An assembly as in claim 7 wherein said laser is an excimer laser.

* * * * *